US008562745B2

(12) United States Patent  
Rozenzon et al.

(10) Patent No.: US 8,562,745 B2
(45) Date of Patent: Oct. 22, 2013

(54) STABLE WAFER-CARRIER SYSTEM

(75) Inventors: Yan Rozenzon, San Carlos, CA (US); Robert T. Trujillo, Saratoga, CA (US); Steven C. Beese, Fremont, CA (US)

(73) Assignee: Silevo, Inc., Fremont, CA (US)

( * ) Notice: Subject to any disclaimer, the term of this patent is extended or adjusted under 35 U.S.C. 154(b) by 386 days.

(21) Appl. No.: 12/963,445

(22) Filed: Dec. 8, 2010

(65) Prior Publication Data

US 2011/0283941 A1 Nov. 24, 2011

Related U.S. Application Data

(60) Provisional application No. 61/347,361, filed on May 21, 2010.

(51) Int. Cl.
- *C23C 16/00* (2006.01)
- *C23F 1/00* (2006.01)
- *H01L 21/306* (2006.01)

(52) U.S. Cl.
USPC .... 118/728; 118/715; 156/345.1; 156/345.51

(58) Field of Classification Search
USPC .................. 118/715, 728; 156/345.1, 345.51
See application file for complete search history.

(56) References Cited

U.S. PATENT DOCUMENTS

| | | | | | |
|---|---|---|---|---|---|
| 4,839,145 | A | * | 6/1989 | Gale et al. | 118/725 |
| 4,858,558 | A | * | 8/1989 | Ohmura et al. | 118/725 |
| 5,614,447 | A | * | 3/1997 | Yamaga et al. | 438/795 |
| 6,262,393 | B1 | * | 7/2001 | Imai et al. | 219/390 |
| 2010/0263587 | A1 | * | 10/2010 | Sivaramakrishnan et al. | 117/94 |
| 2011/0067632 | A1 | * | 3/2011 | Poppe et al. | 118/728 |

* cited by examiner

*Primary Examiner* — Jeffrie R Lund
*Assistant Examiner* — Benjamin Kendall
(74) *Attorney, Agent, or Firm* — Shun Yao; Park, Vaughan, Fleming & Dowler LLP

(57) ABSTRACT

One embodiment of the present invention provides a wafer-carrier system used in a deposition chamber for carrying wafers. The wafer-carrier system includes a base susceptor and a top susceptor nested inside the base susceptor with its wafer-mounting side facing the base susceptor's wafer-mounting side, thereby forming a substantially enclosed narrow channel. The base susceptor provides an upward support to the top susceptor.

22 Claims, 6 Drawing Sheets

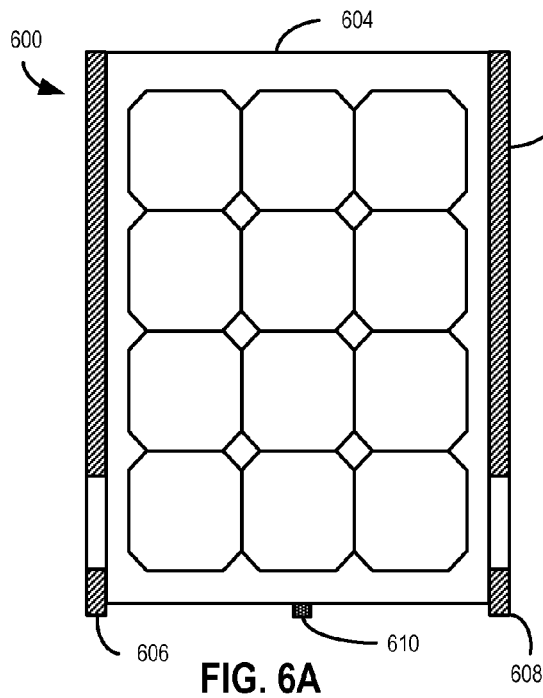
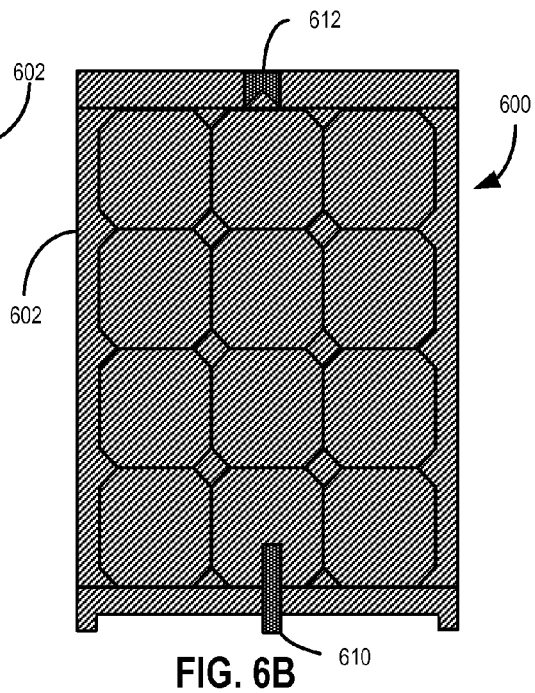
FIG. 6A
FIG. 6B
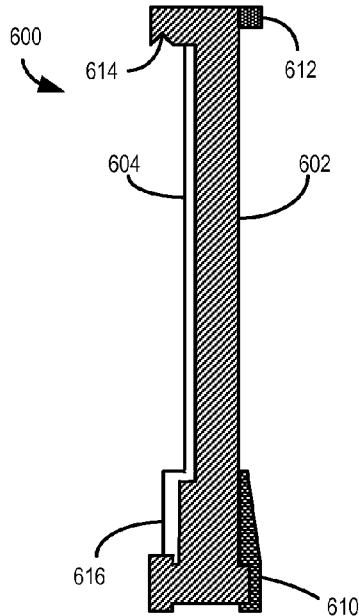
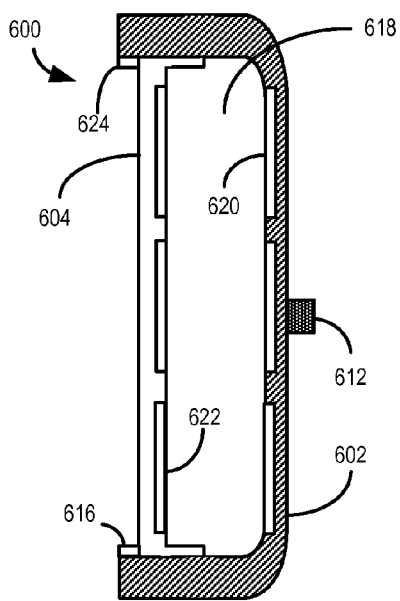
FIG. 6C
FIG. 6D

STABLE WAFER-CARRIER SYSTEM

RELATED APPLICATION

This application claims the benefit of U.S. Provisional Application No. 61/347,361, entitled "SUSCEPTOR STABILITY" by inventors Yan Rozenzon, Robert T. Trujillo, and Steven C. Beese, filed 21 May 2010.

The subject matter of this application is related to the subject matter of U.S. patent application Ser. No. 12/355,463, entitled "SCALABLE, HIGH-THROUGHPUT, MULTI-CHAMBER EPITAXIAL REACTOR FOR SILICON DEPOSITION," by inventors Steve Poppe, Yan Rozenzon, David Z. Chen, Xiaole Yan, Peijun Ding, and Zheng Xu, filed 16 Jan. 2009, the disclosures of which are incorporated by reference in their entirety herein.

This invention was made with government support under DE-EE0000589 awarded by Department of Energy. The government has certain rights in the invention.

BACKGROUND

1. Field

This disclosure is generally related to material deposition. More specifically, this disclosure is related to a wafer-carrier system used in a material deposition reactor.

2. Related Art

The negative environmental impact caused by the use of fossil fuels and their rising cost have resulted in a dire need for cleaner, cheaper alternative energy sources. Among different forms of alternative energy sources, solar power has been favored for its cleanness and wide availability.

A solar cell converts light into electricity using the photoelectric effect. There are several basic solar cell structures, including a single p-n junction, p-i-n/n-i-p, and multi-junction. A typical single p-n junction structure includes a p-type doped layer and an n-type doped layer of similar material. A heterojunction structure includes at least two layers of materials of different bandgaps. A p-i-n/n-i-p structure includes a p-type doped layer, an n-type doped layer, and an optional intrinsic (undoped) semiconductor layer (the i-layer) sandwiched between the p-layer and the n-layer. A multi junction structure includes multiple semiconductor layers of different bandgaps stacked on top of one another.

In a solar cell, light is absorbed near the p-n junction generating carriers. The carriers diffuse into the p-n junction and are separated by the built-in electric field, thus producing an electrical current across the device and external circuitry. An important metric in determining a solar cell's quality is its energy-conversion efficiency, which is defined as the ratio between power converted (from absorbed light to electrical energy) and power collected when the solar cell is connected to an electrical circuit.

Materials that can be used to construct solar cells include amorphous silicon (a-Si), polycrystalline silicon (poly-Si), crystalline silicon (c-Si), cadmium telluride (CdTe), etc. FIG. 1 illustrates an exemplary crystalline-silicon thin-film solar cell. Solar cell 100 includes a low-grade crystalline-Si substrate 102, a p-type doped single-crystal Si layer 104, an $n^+$ silicon emitter layer 106, front electrodes 108, and an Al back electrode 110. Arrows in FIG. 1 indicate incident sunlight.

Based on industrial surveys, c-Si wafer-based solar cells dominate nearly 90% of the market. However, the cost of producing c-Si wafer-based solar cells is high, and the waste of Si material during the ingot-cutting process and the wafer-polishing process has caused a bottleneck in the supply of crystalline-Si wafers. Due to the soaring price and the supply shortage of Si material, there has been a great interest in alternative ways to manufacture solar cells. Recently, photovoltaic thin-film technology has been drawing vast interest because it can significantly reduce the amount of material used, thus lowering the cost of solar cells. Among various competing technologies, single-crystal Si thin-film solar cells have drawn great interest for their low cost and high efficiency.

Single-crystal Si thin-film solar cells can be created using conventional semiconductor epitaxy technologies which not only reduce manufacturing costs but also enable flexible doping levels in the emitter, absorber and back surface field of the solar cell, thus enhancing its efficiency. Single-crystal Si thin-film solar cells with an efficiency as high as 17% have been demonstrated in research labs (see M. Reutuer et al., "17% Efficient 50 µm Thick Solar Cells," *Technical Digest, $17^{th}$ International Photovoltaic Science and Engineering Conference, Fukuoka, Japan*, p. 424).

A high-quality single-crystal Si thin film can be produced using Si epitaxy, which has been widely used in the semiconductor industry to create a high-quality single-crystal Si layer for CMOS integrated circuits, power devices and high-voltage discrete devices. Among possible Si epitaxial deposition techniques, trichlorosilane (TCS) based chemical vapor deposition (CVD) can provide a deposition rate of up to 10 µm/min. Therefore, it is possible to achieve a high-throughput and low-cost epitaxial process for solar cell application.

However, there is a lack of suitable Si epitaxy tools that can meet the demand for high throughput and low deposition cost for Si film layers with thicknesses up to several tens of microns, as required by the solar cell industry. Existing Si epitaxy tools, such as AMC7810™ and Centura 5200™ by Applied Materials, Inc., of Santa Clara, Calif., US; MT7700™ by Moore Epitaxial, Inc., of Tracy, Calif., US; PE2061™ by LPE Epitaxial Technology of Italy; and Epsilon 3200™ by ASM International of the Netherlands, are optimized for the needs of semiconductor device manufacturing. Although these epitaxial tools can deliver Si films with the highest quality, these tools are not compatible, in terms of throughput and gas conversion efficiency, with the economics of the solar cell industry.

FIG. 2 presents a diagram illustrating the structure of an existing barrel epitaxial reactor (prior art), such as that used for the batch processing of multiple wafers. Barrel reactor 200 includes a reaction chamber 202, which has a gas inlet 204 at the top and a vent 206 at the bottom. A vertically positioned susceptor 208 holds a number of wafers, such as wafer 210. Radio frequency (RF) heating coils 212 radiate heat onto the susceptor and wafers. Although barrel reactor 200 can batch process multiple wafers, the number of wafers it can process is limited by the architect of the system, the size of the chamber, and the design of the susceptor. Once built, it is difficult to modify the reactor or the susceptor to accommodate more wafers. In addition, the susceptor needs to be rotated during deposition in order to allow a uniform gas flow over each wafer during the deposition process.

SUMMARY

One embodiment of the present invention provides a wafer-carrier system used in a deposition chamber for carrying wafers. The wafer-carrier system includes a base susceptor and a top susceptor nested inside the base susceptor with its wafer-mounting side facing the base susceptor's wafer-mounting side, thereby forming a substantially enclosed narrow channel. The base susceptor provides an upward support to the top susceptor.

In a variation on the embodiment, the base susceptor and/or the top susceptor are formed using SiC-coated graphite or monolithic SiC.

In a variation on the embodiment, the cross section of the base susceptor is C-shaped, the cross section of the top susceptor is also C-shaped to allow the C-shaped top susceptor to nest in the C-shaped base susceptor, and the openings of the top susceptor and the bottom susceptor are facing opposite directions.

In a variation on the embodiment, the base susceptor includes a three-point supporting mechanism configured to provide substantially stable upward support to the wafer-carrier system.

In a variation on the embodiment, the base susceptor further includes a suspension mechanism configured to allow the wafer-carrier system to be suspended after being loaded into the deposition chamber, thereby allowing the wafer-carrier system to maintain a substantially vertical orientation after being loaded into the deposition chamber.

In a further variation, the suspension mechanism comprises a hook situated at the top edge of the base susceptor.

In a variation on the embodiment, the base susceptor supports the top susceptor using a pivoting mechanism to allow the top susceptor to pivot against the base susceptor.

BRIEF DESCRIPTION OF THE FIGURES

FIG. 6A presents a diagram illustrating a front-side view of an exemplary wafer-carrier system in accordance with an embodiment of the present invention.

FIG. 6B presents a diagram illustrating a back-side view of an exemplary wafer-carrier system in accordance with an embodiment of the present invention.

FIG. 6C presents a side view of an exemplary wafer-carrier system in accordance with an embodiment of the present invention.

FIG. 6D presents a top view of an exemplary wafer-carrier system in accordance with an embodiment of the present invention.

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

Embodiments of the present invention provide a stable wafer-carrier system for a deposition reactor. The wafer-carrier system includes a pair of susceptors. One of the susceptors acts as a base, and the other susceptor rests on top of the base susceptor. The base susceptor includes an anchoring mechanism configured to anchor the whole wafer-carrier system on top of the bottom gas inlet/exhaust nozzle. In addition, the base susceptor also has a suspension mechanism configured to allow the wafer-carrier system to hang on to the top gas inlet/exhaust nozzle. The suspension mechanism also enables automated loading/unloading of the wafer-carrier system. By attaching the other susceptor on to the base susceptor, the wafer-carrier system avoids contact between the susceptor edges, thus eliminating generation of unwanted particles. Moreover, the suspension design ensures that the susceptors maintain their vertical orientation during deposition, thus providing stability to the wafers.

The Reactor

Figure 1:
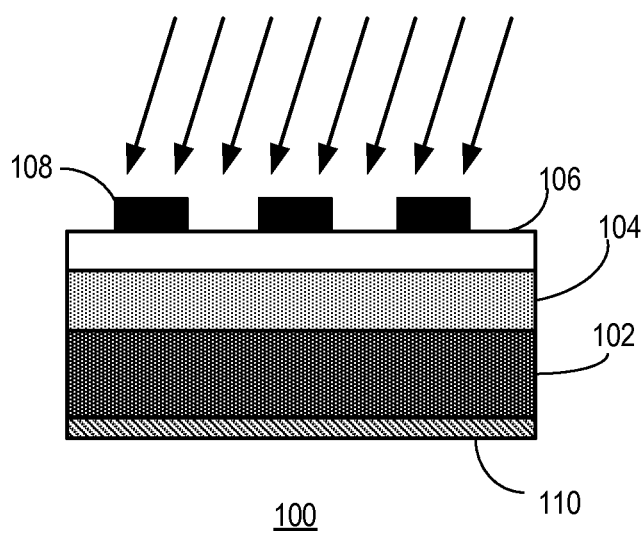
FIG. 1 presents a diagram illustrating the structure of an exemplary crystalline-Si thin-film solar cell.
Figure 2:
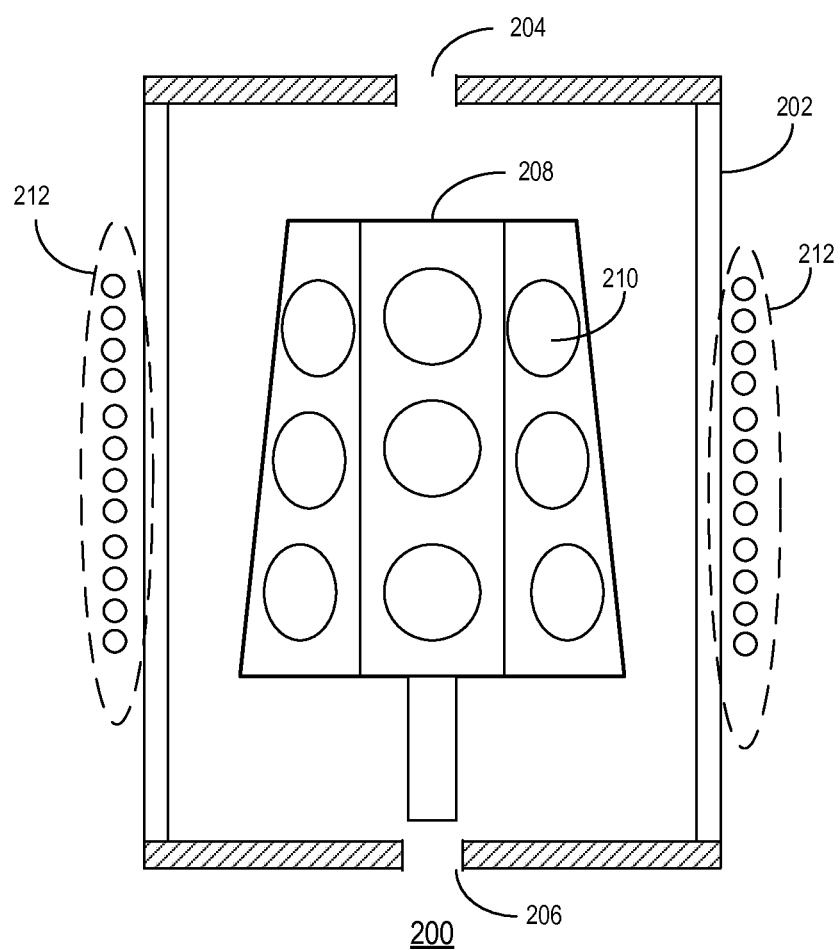
FIG. 2 presents a diagram illustrating a barrel reactor (prior art).
Figure 3:
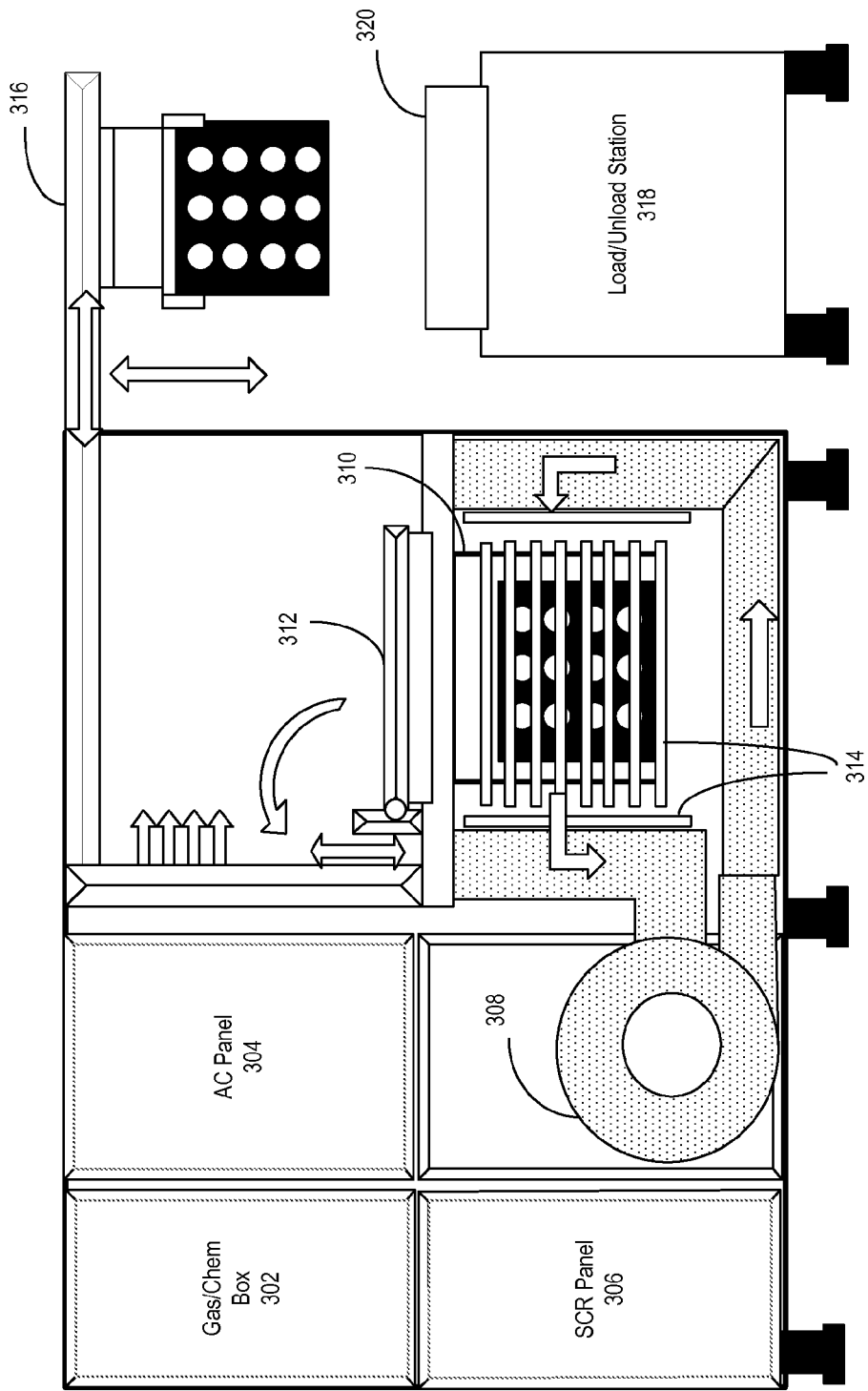
FIG. 3 presents a block diagram illustrating the side view of a 9-chamber epitaxial reactor in accordance with an embodiment of the present invention.

FIG. 3 presents a block diagram illustrating the side view of an epitaxial reactor in accordance with an embodiment. The reactor includes gas/chemical sources (such as a gas/chemical box 302), various control panels (such as an AC (alternating current) panel 304 and an SCR (silicon-controlled rectifier) panel 306), a three-zone heat exchanger and blower 308 which resides beneath AC panel 304, and a number of reaction chambers (such as reaction chamber 310, which is surrounded by lamp heating units 314 and covered with a lid 312). The reactor also includes a running beam 316 attached to the front of the reactor and interfacing with a factory load/unload susceptor station 318, on top of which sits a susceptor stand 320 holding susceptors to be loaded into chamber 310.

Figure 4C:
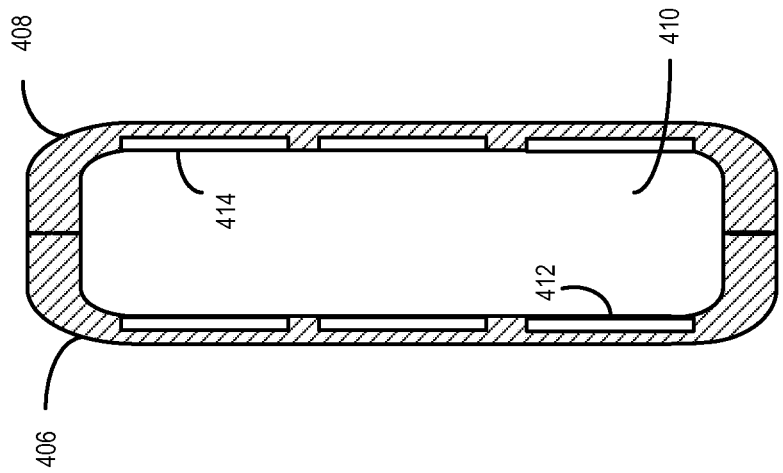
FIG. 4C presents a diagram illustrating the cross-sectional top view of a pair of susceptors in accordance with an embodiment of the present invention.

A detailed description of the deposition reactor, including the reactor chamber and the gas nozzles, can be found in U.S. patent application Ser. No. 12/355,463, entitled "SCALABLE, HIGH-THROUGHPUT, MULTI-CHAMBER EPITAXIAL REACTOR FOR SILICON DEPOSITION," by inventors Steve Poppe, Yan Rozenzon, David Z. Chen, Xiaole Yan, Peijun Ding, and Zheng Xu, filed 16 Jan. 2009, the disclosures of which are incorporated by reference in their entirety herein The Susceptors In order to improve the utilization of precursor gas and to prevent deposition on chamber walls, during deposition, a pair of susceptors, each carrying a number of wafers, is placed inside the reaction chamber. FIG. 4A presents a diagram illustrating the front side of a susceptor in accordance with an embodiment of the present invention. During deposition, a susceptor 402 is placed vertically inside the reactor chamber. To avoid heat absorption by chamber walls, the reactor chamber is formed using a material that is transparent to radiant heat. In one embodiment, the reactor chamber is formed using quartz. By contrast, susceptor 402 is formed using a material that is opaque and absorbs radiant heat energy, such as SiC-coated graphite and monolithic SiC. In one embodiment, susceptor 402 is formed using SiC-coated graphite. As a result, most of the radiant heat from lamp-heating units located outside the reactor chamber is absorbed by susceptor 402.

The front side of susceptor 402 includes a set of pockets, such as pocket 404, for supporting substrates to be deposited. The shape of the bottom of the pockets is carefully designed to ensure a good thermal contact between the susceptor and the substrates. In one embodiment, the bottom of pocket 404 has a contour shape. Depending on the size of susceptor 402, various numbers of substrates can fit onto susceptor 402. In one embodiment, susceptor 402 includes 12 pockets for supporting 12 125×125 mm$^2$ substrates.

Figure 4B:
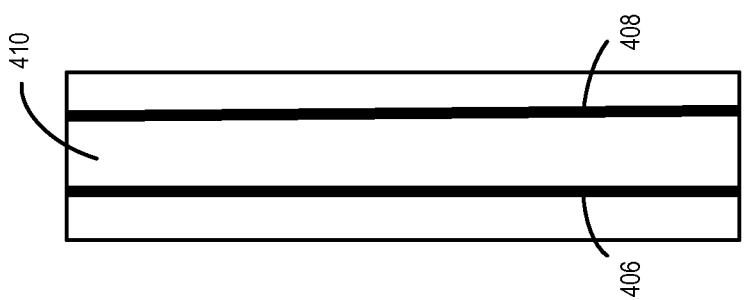
FIG. 4B presents a diagram illustrating the relative position of a pair of susceptors within a reactor in accordance with an embodiment of the present invention.
Figure 4A:
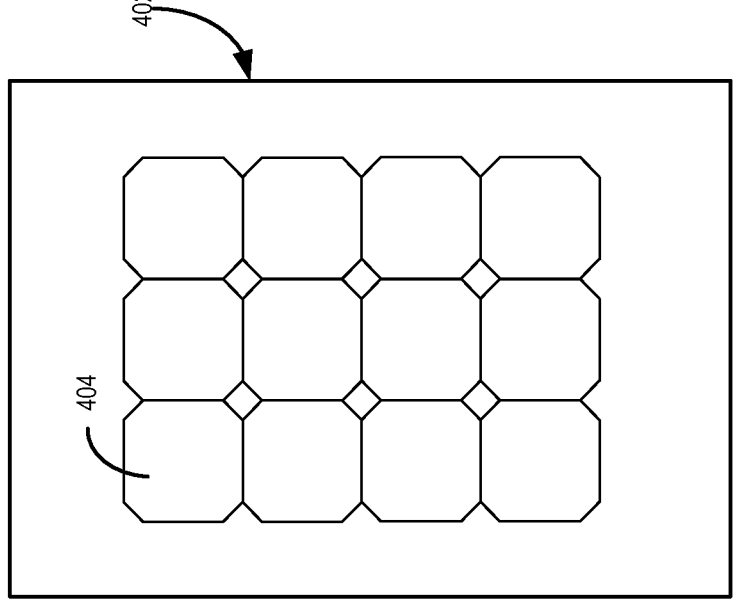
FIG. 4A presents a diagram illustrating the front side of a susceptor in accordance with an embodiment of the present invention.

FIG. 4B presents a diagram illustrating the relative position of a pair of susceptors within a reactor in accordance with an embodiment of the present invention. In FIG. 4B, a pair of susceptors, susceptor 406 and susceptor 408, are placed vertically inside the reaction chamber facing each other. A narrow channel 410 is formed between susceptors 406 and 408. FIG. 4C presents a diagram illustrating the cross-sectional top view of a pair of susceptors in accordance with an embodiment of the present invention. In FIG. 4C, the cross sections of susceptors 406 and 408 are C-shaped. The vertical edges of susceptors 406 and 408 are in contact with each other, forming an enclosed narrow channel 410. The wafers mounted on susceptors 406 and 408, such as wafers 412 and 414, are placed in such a way that their deposition surface is facing narrow channel 410. As a result, during deposition, the precursor gases, such as TCS, can be contained within narrow channel 410. Other examples of precursor gases include, but are not limited to: $SiH_4$, $SiH_2Cl_2$, and $SiCl_4$. In addition to the "C" shape, the cross sections of susceptors 406 and 408 can form other shapes, including but not limited to: half circle, half eclipse, and other regular or irregular shapes. Note that the front sides (i.e., the wafer-holding sides) of susceptors 406 and 408 are facing each other. Thus, the deposition substrates, such as substrates 412 and 414, have their deposition surfaces surrounding channel 410, which contains the precursor gases and keeps them from depositing material on the inner walls of the reactor chamber. Such a configuration can increase the TCS gas utilization rate significantly, because the probability for the TCS gas to successfully deposit Si on substrate surfaces is now much higher. The increased deposition probability results from the precursor gases being surrounded by deposition surfaces, as well as the reduced deposition on the inner walls of the reactor chamber.

Figure 5B:
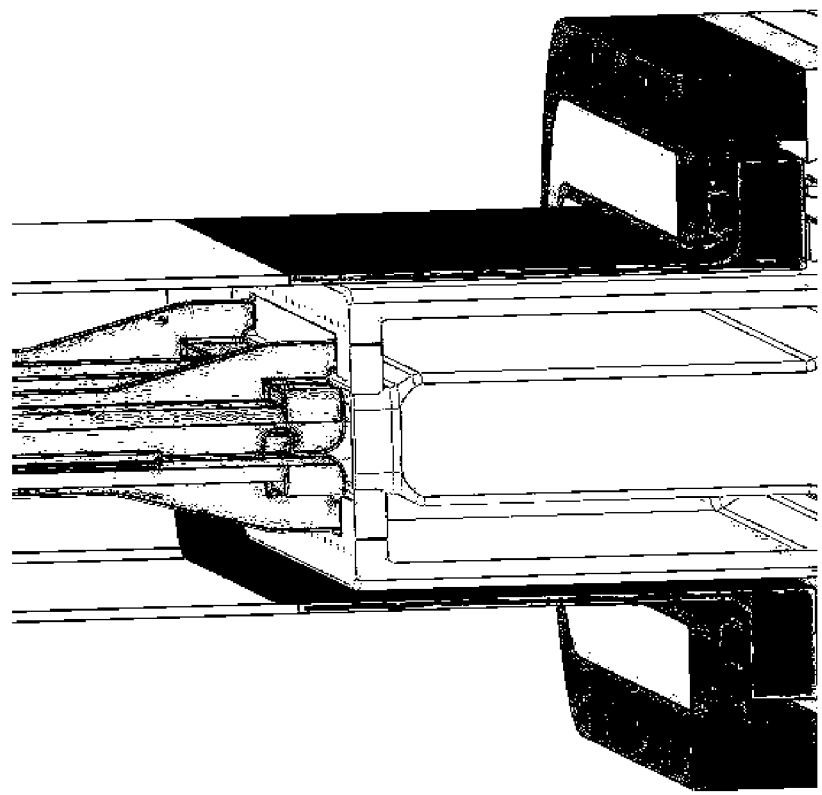
FIG. 5B illustrates a 3-dimensional image of the susceptor pair and the bottom gas inlet/exhaust nozzle (prior art).
Figure 5A:
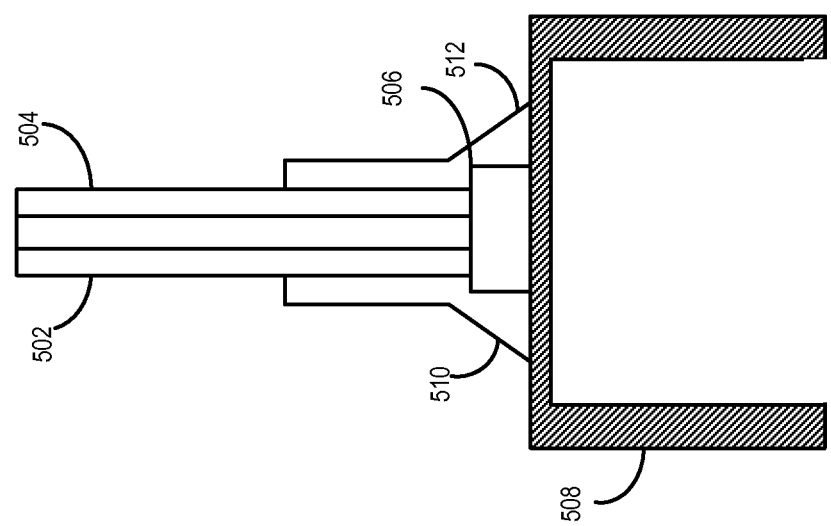
FIG. 5A presents a diagram illustrating a partial front view of a susceptor pair resting on the bottom gas inlet/exhaust nozzle (prior art).

In a conventional wafer-carrier system, the susceptor pair can be similarly constructed, and an interlocking mechanism couples the bottom of the susceptors together. During deposition, the coupled susceptor pair is placed on top of the bottom gas inlet/exhaust nozzle. FIG. 5A presents a diagram illustrating a partial front view of a susceptor pair resting on the bottom gas inlet/exhaust nozzle (prior art). In FIG. 5A, a pair of susceptors, susceptor 502 and susceptor 504, are coupled together by an interlocking mechanism 506. Each susceptor includes its own supporting base to allow the susceptor pair to rest on top of a bottom gas inlet/exhaust nozzle 508. For example, susceptor 502 includes a supporting base 510, and susceptor 504 includes a supporting base 512. FIG. 5B illustrates a 3-dimensional image of the susceptor pair and the bottom gas inlet/exhaust nozzle (prior art).

From FIGS. 5A and 5B, one can see that interlocking mechanism 506 locks the bottom of susceptors 502 and 504 together, resulting in contact between the front edges of the susceptors. Such a configuration can be problematic, especially in a deposition reactor that employs quartz-based chamber and gas nozzles. Due to the material properties of quartz, the manufacture of a quartz chamber and gas nozzles often result in alignment imprecision. For example, the surface of the bottom gas inlet/exhaust nozzle, on top of which sits the wafer-carrier system (the susceptor pair), may be tilted or skewed with respect to the surface of the top gas inlet/exhaust nozzle. Such misalignment, combined with a relatively large aspect ratio of the chamber's height to its base dimensions can result in a slight tilt of the susceptor pair system with respect to the gas-delivery surface of the top gas inlet/exhaust nozzle. Consequently, the narrow channel formed by the interlocked susceptor pair may be misaligned with the gas-delivery holes of the top gas-delivery system, including the quartz gas nozzle and the stainless steel gas manifold. In some situations, the susceptor pair may partially or fully cover the gas-delivery holes, which can adversely affect the deposition uniformity.

In addition, when the automated susceptor loading arm loads the susceptor pair into the chamber, the susceptor pairs are placed on the surface of the bottom gas inlet/exhaust nozzle. Such an automated process cannot guarantee 100% precision, and the susceptor pairs may be tilted or unstable on the nozzle surface. The unstable or tilted susceptors can increase the possibility of the wafers falling out of the pocket during deposition. Moreover, in the configuration shown in FIGS. 5A and 5B, the susceptors are leaning against each other with their front edges touching. This configuration may result in the front edges rubbing against each other during deposition as a result of thermal expansion, thus generating large amounts of particles, which contaminate the deposition chamber. In time, the rubbing can lead to the cracking of the SiC coating and the exposure of the susceptors' graphite cores.

To resolve the aforementioned stability and tilting issues, in embodiments of the present invention, a stable wafer-carrier system that uses one susceptor as a base susceptor is implemented. By allowing only one susceptor to act as the supporting base, this novel wafer-carrier system avoids the problem of susceptors rubbing against each other. In addition, the base susceptor also includes a mechanism which not only allows the automated arm to pick up the wafer-carrier system during loading but also allows the wafer-carrier system to hang from the top gas inlet/exhaust nozzle.

FIG. 6A presents a diagram illustrating a front-side view of an exemplary wafer-carrier system in accordance with an embodiment of the present invention. A wafer-carrier system 600 includes a pair of susceptors, susceptors 602 and 604. Susceptor 602 acts as the base susceptor to support wafer-carrier system 600. To do so, in one embodiment, susceptor 602 includes three feet 606, 608, and 610. Two of the feet (feet 606 and 608) are located at the front edge of susceptor 602, and one foot (foot 610) is located at approximately the center of the bottom of the back surface of susceptor 602. Note that these three feet provide stable support for wafer-carrier system 600 while it is sitting on the load/unload station and while it is resting on the surface of the bottom gas inlet/exhaust nozzle. In addition to providing support for wafer-carrier system 600, feet 606 and 608 extend beyond the base region of susceptor 602 to allow susceptor 604 to rest on top of them.

FIG. 6B presents a diagram illustrating a back-side view of an exemplary wafer-carrier system in accordance with an embodiment of the present invention. From FIG. 6B, one can see the back side of susceptor 602, with foot 610 attached to susceptor 602 at its bottom center. As discussed previously, foot 610, together with feet 606 and 608, provides a stable support to wafer-carrier system 600. FIG. 6B also illustrates that a small hook 612 is located at the approximate center of the top edge of susceptor 602. Hook 612 allows the automated loading arm to pick up wafer-carrier system 600. In addition, hook 612 also allows wafer-carrier system 600 to hang from the top gas-delivery system. In one embodiment, hook 612 grabs a pin situated on the top gas-delivery system to allow wafer-carrier system 600 to be suspended inside the deposition chamber with its bottom slightly away from the bottom gas inlet/exhaust nozzle. As a result, an accurate alignment between the narrow gas channel formed by the susceptor pair and the gas-delivery holes can be maintained, because gravity can ensure that wafer-carrier system 600 keeps a near-perfect vertical orientation. The vertical orientation of the susceptors is essential to ensure that the wafers can maintain their desired positions, thus providing stability. Note that the tilted susceptors can cause the wafers to fall out of the susceptor pockets. During deposition, due to the increased temperature (which can reach up to 1200° C.), wafer-carrier system 600 may expand in the vertical direction. As a result of the expansion, the bottom of wafer-carrier system 600, i.e., the three feet of susceptor 602, come into contact with the top surface of the bottom gas inlet/exhaust nozzle, and hook 612 may lose contact with the pin from which it hangs. Consequently, wafer-carrier system 600 is now supported by the three feet of susceptor 602 and maintains its upright orientation. However, after deposition, as wafer-carrier system 600 cools down and contracts, hook 612 will resume its contact with the pin again, thus resulting in wafer-carrier system being suspended in the chamber again.

FIG. 6C presents a side view of an exemplary wafer-carrier system in accordance with an embodiment of the present invention. From FIG. 6C, one can see the relative position of susceptors 602 and 604. Susceptor 602 (marked by the shaded area) acts as a base, while susceptor 604 nests inside susceptor 602. From FIG. 6C, one can see clearly that the feet of susceptor 602, including foot 610, provide support for wafer-carrier system 600. In addition to hook 612, FIG. 6C also illustrates that, in one embodiment, susceptor 602 can also include a pair of hooks on the top edge of its front surface, such as a hook pair 614. Similar to hook 612, hook pair 614 on the top edge of the front surface of susceptor 602 can facilitate the automated loading arm to pick up wafer-carrier system 600 during loading and unloading. Note that from FIG. 6C one can see that with susceptor 604 nested inside susceptor 602, the problem of the two susceptors rubbing against each other is alleviated, thus eliminating the generation of unwanted particles during deposition. In addition, the bottom contact point between susceptors 602 and 604, i.e., contact point 616, includes a pivoting mechanism that allows susceptor 604 to pivot against susceptor 602.

FIG. 6D presents a top view of an exemplary wafer-carrier system in accordance with an embodiment of the present invention. From FIG. 6D one can see that an enclosed narrow channel 618 (similar to channel 410 shown in FIG. 4C) is formed by the pair of susceptors 602 and 604. Each susceptor faces inward to channel 618, and the front surface of each susceptor includes a number of pockets, such as pockets 620 and 622, for holding wafers to be deposited. As one can see from FIG. 6D, when processing gas enters channel 618, it can be deposited on the surfaces of the wafers. The difference between FIG. 4C and FIG. 6D is that, in FIG. 4C, the front edges of the two susceptors are leaning against each other, which may result in rubbing between them, whereas in FIG. 6D, susceptor 604 nests inside susceptor 602 with its front edge not touching the front edge of susceptor 602, thus preventing the occurrence of rubbing. In addition, pivoting mechanism 616 and 624 allows susceptor 604 to pivot against susceptor 602.

Figure 7A:
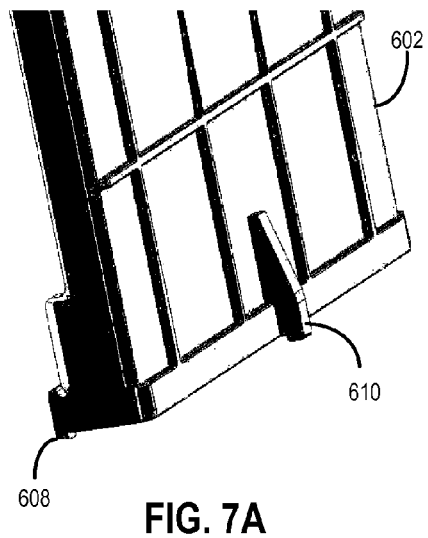
FIG. 7A presents a 3-dimensional diagram illustrating in more detail the feet of the base susceptor in accordance with an embodiment of the present invention.

FIG. 7A presents a 3-dimensional diagram illustrating in more detail the feet of the base susceptor in accordance with an embodiment of the present invention. From FIG. 7A, one can see that a foot 610 is attached to base susceptor 602 at the approximate center of the bottom edge of susceptor 602. Foot 610, together with feet located on the front bottom edge of susceptor 602, such as foot 608, provides a stable support for the susceptor pair.

Figure 7B:
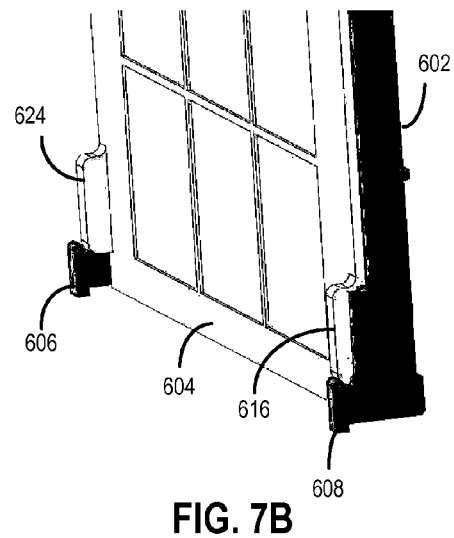
FIG. 7B presents a 3-dimensional diagram illustrating in more detail the pivoting mechanism in accordance with an embodiment of the present invention.

FIG. 7B presents a 3-dimensional diagram illustrating in more detail the pivoting mechanism in accordance with an embodiment of the present invention. From FIG. 7B, one can see that pivoting mechanisms 616 and 624 are located at the bottom contacts between susceptors 602 and 604 to allow susceptor 604 to pivot against the bottom of susceptor 602.

Figure 7C:
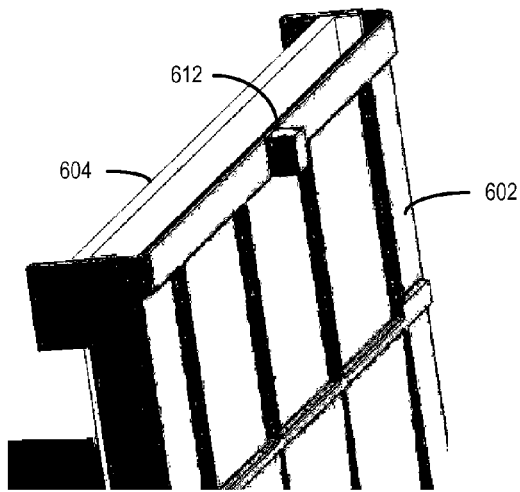
FIG. 7C presents a 3-dimensional diagram illustrating in more detail the suspension mechanism in accordance with an embodiment of the present invention.

FIG. 7C presents a 3-dimensional diagram illustrating in more detail the suspension mechanism in accordance with an embodiment of the present invention. From FIG. 7C, one can see that a hook 612 is attached to susceptor 602 at the approximate center of the top edge of susceptor 602. Hook 612 facilitates the automated arm to pick up the susceptor pair during loading and unloading. In addition, hook 612 allows the susceptor pair to hang from the upper gas delivery system, thus ensuring a near-perfect vertical orientation of the susceptor pair.

Note that, although this disclosure gives an example of a wafer-carrier system using the geometric configuration shown in FIGS. 6 and 7, other configurations are also possible. The locations and shapes of the susceptor feet, the hook, and the pivoting mechanism can be different from the example shown in FIGS. 6 and 7. In addition, the numbers of wafers carried by each susceptor can also be more or fewer than the example shown in FIGS. 6 and 7.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A wafer-carrier system used in a deposition chamber for carrying wafers, comprising:
    a base susceptor; and
    a top susceptor nested inside the base susceptor with its wafer-mounting side facing the base susceptor's wafer-mounting side, thereby forming a substantially enclosed narrow channel;
    wherein the base susceptor provides an upward support to the top susceptor.

2. The wafer-carrier system of claim 1, wherein the base susceptor and/or the top susceptor are formed using at least one of: SiC-coated graphite and monolithic SiC.

3. The wafer-carrier system of claim 1, wherein the cross section of the base susceptor is C-shaped, wherein the cross section of the top susceptor is also C-shaped to allow the C-shaped top susceptor to nest in the C-shaped base susceptor, and wherein the openings of the top susceptor and the base susceptor are facing opposite directions.

4. The wafer-carrier system of claim 1, wherein the base susceptor includes a three-point supporting mechanism configured to provide substantially stable upward support to the wafer-carrier system.

5. The wafer-carrier system of claim 1, wherein the base susceptor further includes a suspension mechanism configured to allow the wafer-carrier system to be suspended after being loaded into the deposition chamber, thereby allowing the wafer-carrier system to maintain a substantially vertical orientation after being loaded into the deposition chamber.

6. The wafer-carrier system of claim 5, wherein the suspension mechanism comprises a hook situated at the top edge of the base susceptor.

7. The wafer-carrier system of claim 1, wherein the base susceptor supports the top susceptor using a pivoting mechanism to allow the top susceptor to pivot against the base susceptor.

8. A reactor for material deposition, comprising:
a chamber;
a top gas nozzle situated at the top of the chamber;
a bottom gas nozzle situated at the bottom of the chamber; and
a wafer-carrier system situated inside the chamber for carrying wafers, comprising:
   a base susceptor; and
   a top susceptor nested inside the base susceptor with its wafer-mounting side facing the base susceptor's wafer-mounting side, thereby forming a substantially enclosed narrow channel;
   wherein the base susceptor provides an upward support to the top susceptor.

9. The reactor of claim 8, wherein the base susceptor and/or the top susceptor are formed using at least one of: SiC-coated graphite and monolithic SiC.

10. The reactor of claim 8, wherein the chamber is formed using a material comprising quartz.

11. The reactor of claim 8, wherein the cross section of the base susceptor is C-shaped, wherein the cross section of the top susceptor is also C-shaped to allow the C-shaped top susceptor to nest in the C-shaped base susceptor, and wherein the openings of the top susceptor and the bottom susceptor are facing opposite directions.

12. The reactor of claim 8, wherein the base susceptor includes a three-point supporting mechanism configured to provide substantially stable upward support to the wafer-carrier system when the wafer-carrier system is resting on the bottom gas nozzle.

13. The reactor of claim 8, wherein the base susceptor further includes a suspension mechanism configured to allow the wafer-carrier system to hang from the top gas nozzle after being loaded into the deposition chamber, thereby allowing the wafer-carrier system to maintain a substantially vertical orientation after being loaded into the deposition chamber.

14. The reactor of claim 13, wherein the suspension mechanism comprises a hook situated at the top edge of the base susceptor.

15. The reactor of claim 8, wherein the base susceptor supports the top susceptor using a pivoting mechanism to allow the top susceptor to pivot against the base susceptor.

16. A wafer-carrying means, comprising:
means for carrying wafers on a base susceptor; and
means for carrying wafers on a top suceptor, wherein the top susceptor is nested inside the base susceptor with its wafer-mounting side facing the base susceptor's wafer-mounting side, thereby forming a substantially enclosed narrow channel, and wherein the base susceptor provides an upward support to the top susceptor.

17. The wafer-carrying means of claim 16, wherein the base susceptor and/or the top susceptor are formed using at least one of: SiC-coated graphite and monolithic SiC.

18. The wafer-carrying means of claim 16, wherein the cross section of the base susceptor is C-shaped, wherein the cross section of the top susceptor is also C-shaped to allow the C-shaped top susceptor to nest in the C-shaped base susceptor, and wherein the openings of the top susceptor and the base susceptor are facing opposite directions.

19. The wafer-carrying means of claim 16, wherein the base susceptor further include a three-point supporting means for providing substantially stable upward support.

20. The wafer-carrying means of claim 16, wherein the base susceptor further includes a suspension means for allowing the susceptors to be suspended after being loaded into a deposition chamber, thereby allowing the susceptors to maintain a substantially vertical orientation after being loaded into the deposition chamber.

21. The wafer-carrying means of claim 20, wherein the suspension means comprises a hook situated at the top edge of the base susceptor.

22. The wafer-carrying means of claim 16, wherein the base susceptor further includes a pivoting means for allowing the top susceptor to pivot against the base susceptor.

* * * * *